United States Patent
Aoki et al.

(10) Patent No.: US 12,464,613 B2
(45) Date of Patent: Nov. 4, 2025

(54) LEVEL SHIFTER, SEMICONDUCTOR DEVICE, SWITCHING POWER SUPPLY, AND LIGHT EMITTING DEVICE

(71) Applicant: ROHM CO., LTD., Kyoto (JP)

(72) Inventors: Akira Aoki, Kyoto (JP); Ryo Takagi, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 132 days.

(21) Appl. No.: 18/400,443

(22) Filed: Dec. 29, 2023

(65) Prior Publication Data

US 2024/0138039 A1 Apr. 25, 2024
US 2024/0237168 A9 Jul. 11, 2024

Related U.S. Application Data

(63) Continuation of application No. PCT/JP2022/028308, filed on Jul. 21, 2022.

(30) Foreign Application Priority Data

Aug. 6, 2021 (JP) .................................. 2021-129528

(51) Int. Cl.
H05B 45/14 (2020.01)
H05B 45/345 (2020.01)
H05B 45/3725 (2020.01)

(52) U.S. Cl.
CPC ........... *H05B 45/14* (2020.01); *H05B 45/345* (2020.01); *H05B 45/3725* (2020.01)

(58) Field of Classification Search
CPC .. H05B 45/14; H05B 45/345; H05B 45/3725; H05B 45/38; H02M 3/155; H03K 19/0175; H03K 19/08
See application file for complete search history.

(56) References Cited

U.S. PATENT DOCUMENTS

| 2003/0174023 A1* | 9/2003 | Miyasita | H03F 3/45085 330/254 |
| 2009/0039869 A1* | 2/2009 | Williams | H01L 24/06 324/123 R |
| 2011/0141098 A1* | 6/2011 | Yaguma | G09G 3/3696 345/212 |

FOREIGN PATENT DOCUMENTS

| CN | 100499333 C * | 6/2009 | ........... H02M 3/156 |
| CN | 104040862 A * | 9/2014 | ........... H05B 45/382 |

(Continued)

OTHER PUBLICATIONS

International Search Report and Written Opinion in International Appln. No. PCT/JP2022/028308, mailed on Oct. 25, 2022, 13 pages (with machine translation).

*Primary Examiner* — Abdullah A Riyami
*Assistant Examiner* — Syed M Kaiser
(74) *Attorney, Agent, or Firm* — Fish & Richardson P.C.

(57) ABSTRACT

A level shifter includes a current output amplifier configured to output a first output current and a second output current through first and second output terminals thereof, respectively, a first resistor configured to be connected between each of an inverted input terminal and the first output terminal of the current output amplifier and an application terminal of a ground potential, and a second resistor configured to be connected between the second output terminal of the current output amplifier and an application terminal of a negative potential lower than the ground potential. A first analog signal referenced to the ground potential is accepted at a non-inverted input terminal of the current output amplifier, and a second analog signal referenced to the negative potential is outputted through one terminal of the second resistor.

10 Claims, 6 Drawing Sheets

(56) References Cited

FOREIGN PATENT DOCUMENTS

| | | | |
|---|---|---|---|
| CN | 207398896 U | * | 5/2018 |
| JP | 2013-162311 | | 8/2013 |
| JP | 2013162311 A | * | 8/2013 |

* cited by examiner

LEVEL SHIFTER, SEMICONDUCTOR DEVICE, SWITCHING POWER SUPPLY, AND LIGHT EMITTING DEVICE

CROSS-REFERENCE TO RELATED APPLICATIONS

This nonprovisional application is a continuation application of International Patent Application No. PCT/JP2022/028308 filed on Jul. 21, 2022, which claims priority Japanese Patent Application No. 2021-129528 filed on Aug. 6, 2021, the entire contents of which are hereby incorporated by reference.

TECHNICAL FIELD

The invention disclosed in the present description relates to a level shifter, and a semiconductor device, a switching power supply, and a light emitting device that use the level shifter.

BACKGROUND ART

Conventionally, semiconductor devices that operate with reference to a negative potential (such as an LED [light emitting diode], a driver IC, and a switching power supply IC) have been in wide and common use.

An example of a conventional technique related to the above can be seen in Patent Document 1.

CITATION LIST

Patent Literature

Patent Document 1: JP-A-2013-162311

DESCRIPTION OF EMBODIMENTS

<LED Light Emitting Device>

Figure 1:
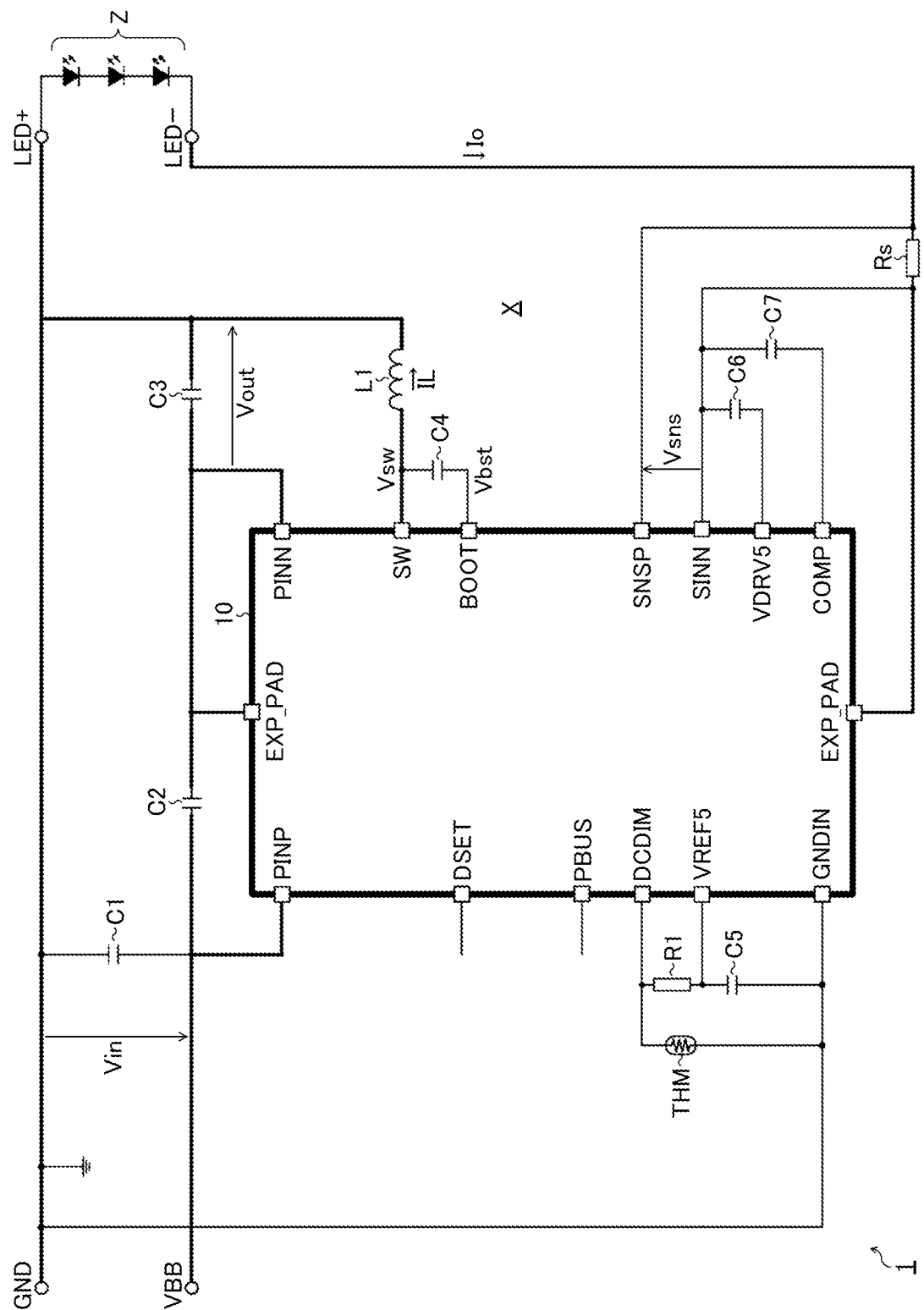
FIG. 1 is a view showing an entire configuration of an LED light emitting device.

FIG. 1 is a view showing an entire configuration of an LED light emitting device. An LED light emitting device 1 of this configuration example includes a switching power supply X and an LED load Z (=an example of a light emitting element that emits light upon receiving supply of an output current Io from the switching power supply X, which, in this figure, is composed of a plurality of LED elements connected in series).

The switching power supply X is a negative step-up/step-down DC/DC converter and is configured by using an LED driver IC 10 and various discrete components (capacitors C1 to C7, an inductor L1, a resistor R1, a sense resistor Rs, and a thermistor THM) externally connected to the LED driver IC 10.

The LED driver IC 10 is a semiconductor device functioning as a component of the switching power supply X that supplies the output current Io to the LED load Z. The LED driver IC 10 includes a plurality of external terminals (such as a PINP pin, a DSET pin, a PBUS pin, a DCDIM pin, a VREF5 pin, a GNDIN pin, a PINN pin, an SW pin, a BOOT pin, an SNSP pin, an SINN pin, a VDRV5 pin, a COMP pin, and a rear-surface pad EXP_PAD) as tools for establishing electrical connection with an exterior of the IC.

The PINP pin is a DC/DC power supply/small-signal power supply input terminal. The DSET pin is a PWM dimming duty setting input terminal (referenced to GNDIN). The PBUS pin is an abnormality detection input/output terminal (referenced to GNDIN). The DCDIM pin is a DC dimming input terminal (referenced to GNDIN). The VREF5 pin is an external 5V reference voltage terminal (referenced to GNDIN). The GNDIN pin is an input GND connection terminal.

The PINN pin is a DC/DC negative reference input terminal. The SW pin is a DC/DC switching output terminal. The BOOT pin is a DC/DC bootstrap capacitance connection terminal. The SNSP pin is an LED current detection terminal (+). The SINN pin is a small-signal negative reference input terminal/LED current detection terminal (−). The VDRV5 pin is an internal 5V reference voltage terminal (referenced to SINN). The COMP pin is a phase compensation capacitance connection terminal (referenced to SINN).

The PINP pin and respective first terminals of the capacitors C1 and C2 are all connected to an application terminal of a power supply voltage VBB. A second terminal of the capacitor C2, a first terminal of the capacitor C3, and the rear-surface pad EXP_PAD are all connected to the PINN pin. The SW pin is connected to respective first terminals of the inductor L1 and the capacitor C4. A second terminal of the capacitor C4 is connected to the BOOT pin. A second terminal of the capacitor C1, a second terminal of the capacitor C3, a second terminal of the inductor L1, and an anode LED+ of the LED load Z are all connected to a ground terminal (=an application terminal of a ground potential GND).

Respective first terminals of the resistor R1 and the thermistor THM are both connected to the DCDIM pin. A second terminal of the resistor R1 and a first terminal of the capacitor C5 are both connected to the VREF5 pin. A second terminal of the thermistor THM, a second terminal of the capacitor C5, and the GNDIN pin are all connected to the ground terminal.

The SNSP pin and a first terminal of the sense resistor Rs are both connected to a cathode LED− of the LED load Z. A second terminal of the senses resistor Rs, respective first terminals of the capacitors C6 and C7, and the rear-surface pad EXP_PAD are all connected to the SINN pin (=an application terminal of an output voltage Vout). A second terminal of the capacitor C6 is connected to the VDRV5 pin. A second terminal of the capacitor C7 is connected to the COMP pin.

Among constituent elements described above, the inductor L1 and the capacitor C3, together with a high-side switch 11H and a low-side switch 11L (details of which will be described later) built into the LED driver IC 10, constitute an output stage of the switching power supply X. Driving control of the output stage is performed by the LED driver IC 10, and the output stage generates the output voltage Vout (<GND) having a negative polarity appearing across the capacitor C3 from an input voltage Vin (>GND) having a positive polarity appearing across the capacitor C1.

The anode (LED+) of the LED load Z is connected to the application terminal of the ground potential GND. The cathode (LED−) of the LED load Z, on the other hand, is connected to the application terminal of the output voltage Vout via the sense resistor Rs. The LED load Z connected in this manner emits light upon receiving supply of the output current Io from the switching power supply X. The sense resistor Rs functions as a current/voltage conversion element that converts the output current Io into a sense voltage Vsns.

<LED Driver IC>

Figure 2:
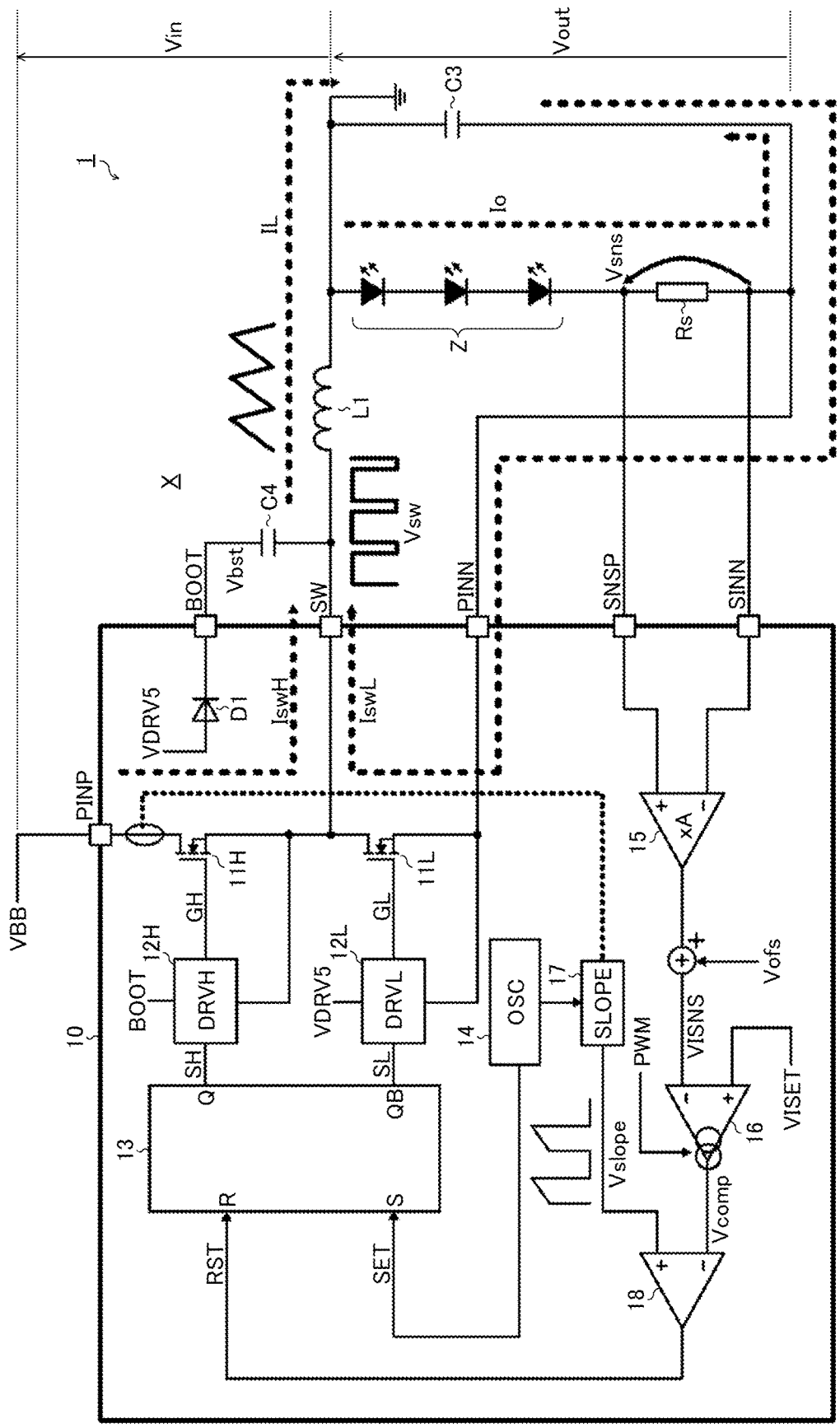
FIG. 2 is a view showing an internal configuration of an LED driver IC.

FIG. 2 is a view showing an internal configuration of the LED driver IC 10. The LED driver IC 10 of this configuration example incorporates therein, as tools for driving the LED load Z, the high-side switch 11H, the low-side switch 11L, a high-side driver 12H, a low-side driver 12L, a controller 13, an oscillator 14, a current sense amplifier 15, an error amplifier 16, a slope signal generation portion 17, a comparator 18, and a bootstrap diode D1. Needless to say, constituent elements (such as various types of protection circuits) other than ones described above may be integrated into the LED driver IC 10.

The high-side switch 11H is connected between the PINP pin and the SW pin and is turned on/off in accordance with a high-side gate signal GH. As the high-side switch 11H, an NMOSFET [N-channel type metal oxide semiconductor field effect transistor] or the like can be suitably used. In that case, the high-side switch 11H is turned on when GH=H (=BOOT) and turned off when GH=L (=SW). It is also possible to use, as the high-side switch 11H, a PMOSFET [P-channel type MOSFET] instead of an NMOSFET. In that case, the bootstrap diode D1, the capacitor C4, and the BOOT pin are no longer required.

The low-side switch 11L is connected between the SW pin and the PINN pin and is turned on/off in accordance with a low-side gate signal GL. As the low-side switch 11L, an NMOSFET or the like can be suitably used. In that case, the low-side switch 11L is turned on when GL=H (=VDRV5) and turned off when GL=L (=PINN).

The high-side switch 11H and the low-side switch 11L connected in this manner constitute a half-bridge output stage (=a part of the output stage of the switching power supply X) that outputs a rectangular wave-shaped switch voltage Vsw through the SW pin. That is, the high-side switch 11H corresponds to an output element, and the low-side switch 11L corresponds to a synchronous rectification element. The inductor L1, the sense resistor Rs, and the LED load Z, which are described earlier, are connected in series to the high-side switch 11H. Furthermore, while in this figure, the half-bridge output stage based on a synchronous rectification scheme is used as an example, in a case of employing a diode rectification scheme, a diode could be used as the low-side switch 11L. Furthermore, the high-side switch 11H and the low-side switch 11L may be externally connected to the LED driver IC 10.

Based on a high-side control signal SH inputted from the controller 13, the high-side driver 12H generates the high-side gate signal GH. A high level of the high-side gate signal GH acts as a boost voltage Vbst (≈Vsw+VDRV5) appearing at the BOOT pin. A low level of the high-side gate signal GH, on the other hand, acts as the switch voltage Vsw appearing at the SW pin.

Based on a low-side control signal SL inputted from the controller 13, the low-side driver 12L generates the low-side gate signal GL. A high level of the low-side gate signal GL acts as a reference voltage VDRV5 (an internal power supply voltage or a separate external input voltage). A low level of the low-side gate signal GL, on the other hand, acts as a terminal voltage of the PINN pin (the output voltage Vout having the negative polarity).

The controller 13 includes, for example, an RS flip-flop that accepts inputs of a set signal SET and a reset signal RST and generates the high-side control signal SH and the low-side control signal SL so that the high-side switch 11H and the low-side switch 11L are turned on/off complementarily to each other.

To be more specific, the controller 13 generates the high-side control signal SH and the low-side control signal SL so that the high-side switch 11H is turned on and the low-side switch 11L is turned off at a rising timing of the set signal SET, whereas the high-side switch 11H is turned off and the low-side switch 11L is turned on at a rising timing of the reset signal RST.

The term "complementarily" used in the present description, however, should be broadly comprehended as encompassing not only a case where respective on/off states of the high-side switch 11H and the low-side switch 11L are completely reversed but also a case where a simultaneous off period (a so-called dead time) for preventing occurrence of a through current is provided.

The oscillator 14 generates the set signal SET at a predetermined switching frequency fsw (for example, several hundreds of kHz).

The current sense amplifier 15 is a differential output amplifier having a floating input stage capable of amplifying an input signal rail to rail. As used herein, the term "floating" refers to a state of being floating (separated in potential) from the ground potential GND.

A non-inverted input terminal (+) of the current sense amplifier 15 is connected to the SNSP pin. An inverted input terminal (−) of the current sense amplifier 15 is connected to the SINN pin. The current sense amplifier 15 connected in this manner amplifies, with a predetermined gain A, the sense voltage Vsns (=Io×Rsns+Vout) referenced to a negative potential (=the output voltage Vout) so as to generate a current detection signal VISNS(=A×Vsns). Accordingly, the larger an average value of the output current Io flowing through the sense resistor Rs, the higher the current detection signal VISNS is, and the smaller the average value of the output current Io, the lower the current detection signal VISNS is. Any offset signal Vofs (for example, several hundreds of mV) may be added to the current detection signal VISNS.

The error amplifier 16 outputs a current corresponding to a difference between the current detection signal VISNS and a current setting signal VISET and charges/discharges the capacitor C7 for phase compensation externally connected to the COMP pin so as to generate an error signal Vcomp. The lower the current detection signal VISNS, the more the error signal Vcomp is increased, and conversely, the higher the current detection signal VISNS, the more the error signal Vcomp is decreased. The error amplifier 16 is also equipped with a function of retaining a signal level of the error signal Vcomp during a PWM dimming off-time.

The slope signal generation portion 17 generates, in synchronism with the set signal SET, a slope signal Vslope including an alternating-current component of the output current Io (=a ripple component of an inductor current IL).

The comparator 18 compares the error signal Vcomp inputted to an inverted input terminal (−) thereof with the slope signal Vslope inputted to a non-inverted input terminal (+) thereof so as to generate the reset signal RST. The reset signal RST turns to a high level when Vcomp<Vslope and to a low level when Vcomp>Vslope. Accordingly, the lower the error signal Vcomp, the earlier the rising timing of the reset signal RST (and hence an off-timing of the high-side switch 11H) is, and the higher the error signal Vcomp, the later the rising timing of the reset signal RST is.

Among constituent elements described above, the high-side driver 12H and the low-side driver 12L, the controller 13, the oscillator 14, the current sense amplifier 15, the error amplifier 16, the slope signal generation portion 17, and the comparator 18 function as an output feedback control unit that, upon accepting inputs of the sense voltage Vsns corresponding to the output current Io of the switching power supply X and the current setting signal VISET, performs driving control of the switching power supply X (aftermentioned inductor average current control). By the output feedback control unit, the high-side switch 11H and the low-side switch 11L are driven complementarily to each other so that a value of the output current Io supplied to the LED load Z through the SW pin agrees with a predetermined target value.

<Inductor Average Current Control>

Figure 3:
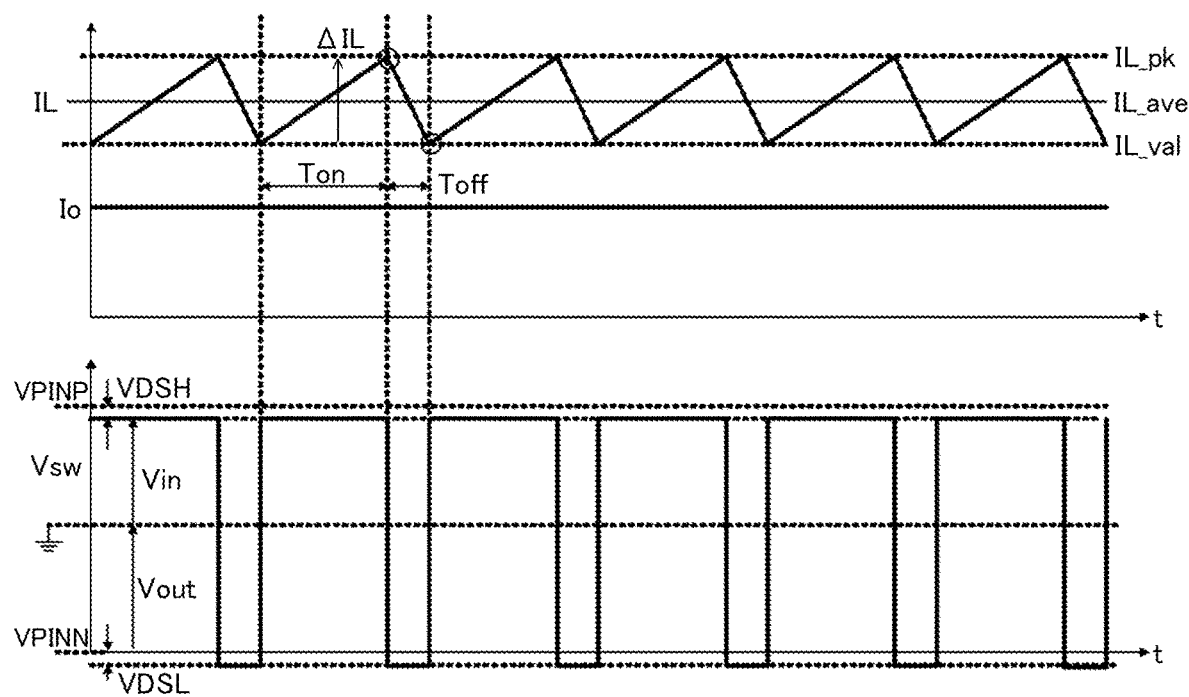
FIG. 3 is a view showing inductor average current control.

FIG. 3 is a view showing the inductor average current control (constant current control) performed by the LED driver IC 10, in which the inductor current IL and the switch voltage Vsw are depicted in order from top to bottom.

During an on-time Ton of the switching power supply X (=a period in which the high-side switch 11H is on and the low-side switch 11L is off), the switch voltage Vsw turns to a high level (=a positive potential lower than a terminal voltage VPINP of the PINP pin by a drain-source voltage VDSH of the high-side switch 11H). At this time, a part of the inductor current IL flowing from the PINP pin to the SW pin via the high-side switch 11H (=a high-side switch current IswH) increases continuously while being used to charge the inductor L1 with energy.

Further, when the inductor current IL increases to a peak value IL_pk corresponding to the error signal Vcomp, Vcomp<Vslope, and thus the reset signal RST rises to the high level. Accordingly, the switching power supply X undergoes a transition to an off-time Toff (=a period in which the high-side switch 11H is off and the low-side switch 11L is on). During the off-time Toff of the switching power supply X, the switch voltage Vsw turns to a low level (=a negative voltage lower than a terminal voltage VPINN of the PINN pin by a drain-source voltage VDSL of the low-side switch 11L). At this time, a part of the inductor current IL flowing from the PINN pin to the SW pin via the low-side switch 11L (=a low-side switch current IswL) decreases continuously as the inductor L1 releases the energy, while being used to charge the capacitor C3 to the negative polarity.

After that, when the set signal SET at the switching frequency fsw rises to a high level, the switching power supply X undergoes a transition back to the on-time Ton, and thus the inductor current IL, which has been decreasing, starts to increase. As a result, the inductor current IL repeatedly increases and decreases between the peak value IL_pk and a bottom value IL_val to have a ripple waveform.

In the switching power supply X that behaves as the negative step-up/step-down

DC/DC converter, unlike in a step-down DC/DC converter, the inductor current IL becomes larger than the output current Io flowing through the LED load Z.

Herein, an on-duty Don of the switching power supply X is expressed by a following formula (1) using the input voltage Vin and the output voltage Vout.

$$Don \approx Vout/(Vin+Vout) \quad (1)$$

Furthermore, an average value IL_ave of the inductor current IL is defined by a following formula (2) using the output current Io and the on-duty Don.

$$IL\_ave \approx Io/(1-Don) \quad (2)$$

Accordingly, a series of operations described above is repeatedly performed, and thus in the LED driver IC 10, output feedback control (the constant current control) based on a PWM [pulse width modulation] control scheme is performed so that the average value IL_ave of the inductor current IL (and hence the output current Io) agrees with a predetermined target value.

A topology of the output feedback control in the LED driver IC 10 is not necessarily limited to the above, and, for example, in place of the PWM control scheme, a bottom detection fixed on-time scheme or a peak detection fixed off-time scheme may be employed.

Meanwhile, in the LED driver IC 10, the average value IL_ave of the inductor current IL (and hence the output current Io) can be variably controlled in accordance with the current setting signal VISET. In this connection, the following describes in detail an analog dimming function of the LED driver IC 10.

<Analog Dimming Function>

Figure 4:
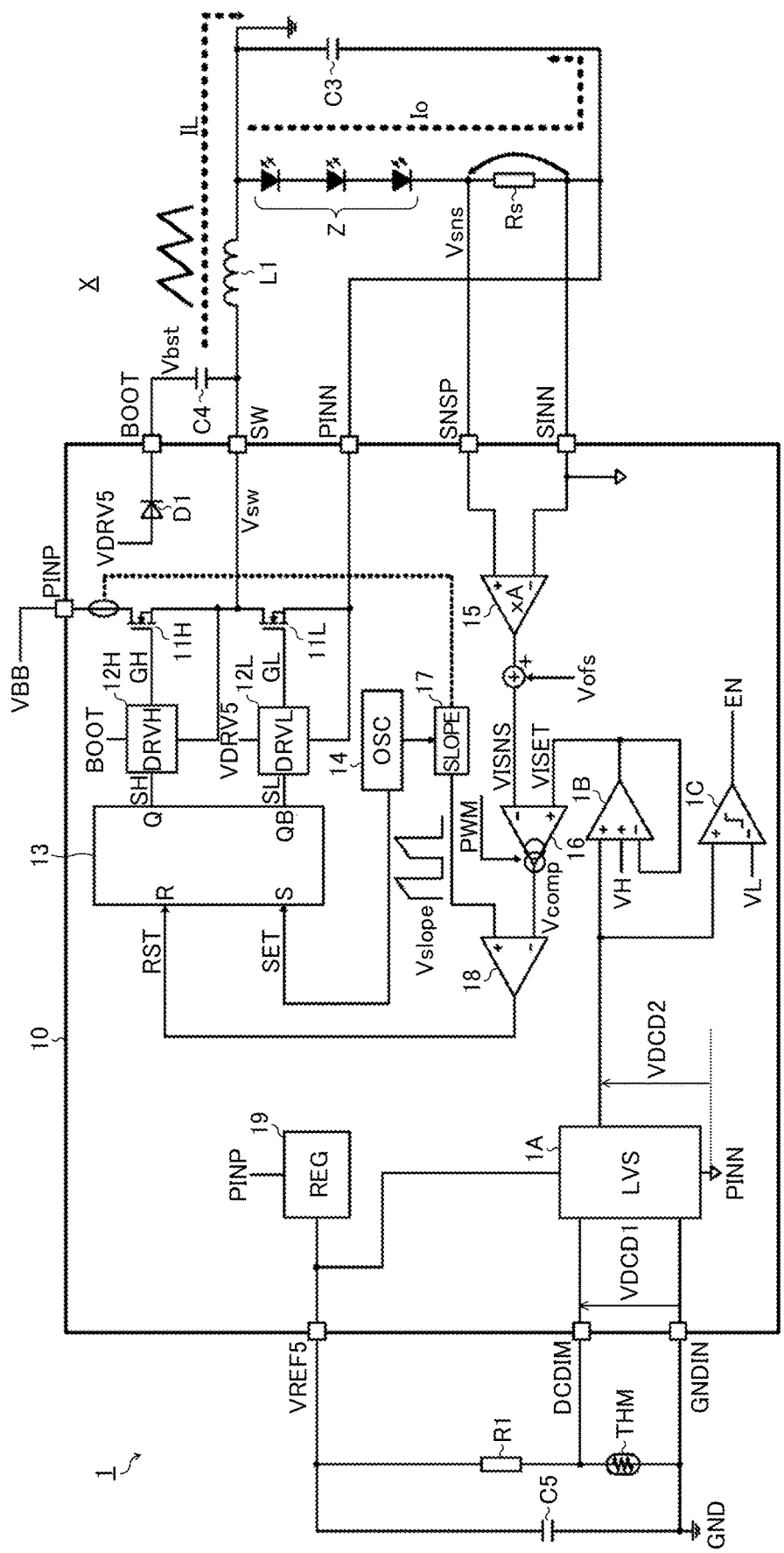
FIG. 4 is a view showing a main part (an analog dimming function) of the LED driver IC.

FIG. 4 is a view showing a main part (an analog dimming portion) of the LED driver IC 10. The LED driver IC 10 of this configuration example includes, as circuit elements for forming the analog dimming portion, a regulator 19, a level shifter 1A, a buffer 1B, and a comparator 1C.

The regulator 19 generates, from the power supply voltage VBB inputted to the PINP pin, a reference voltage VREF5 (for example, 5 V) referenced to the ground potential GND applied to the GNDIN pin as an internal circuitry power supply and an analog dimming/PWM dimming setting power supply.

Upon receiving supply of the reference voltage VREF5, the level shifter 1A operates to perform level shifting from an external analog dimming signal VDCD1 to an internal analog dimming signal VDCD2 and output the internal analog dimming signal VDCD2. The external analog dimming signal VDCD1 is a voltage signal applied between the GNDIN pin (=a ground potential terminal to which the ground potential GND is applied) and the DCDIM pin and corresponds to a first analog signal referenced to the ground potential GND.

Furthermore, the internal analog dimming signal VDCD2 is a voltage signal applied between the PINN pin (=a negative potential terminal to which the output voltage Vout having a negative potential is applied) and an output terminal of the level shifter 1A and corresponds to a second analog signal referenced to the negative potential (=the output voltage Vout).

The buffer 1B outputs, as the current setting signal VISET, either lower one of the internal analog dimming signal VDCD2 and a clamp voltage VH (for example, 2.2 V) to the error amplifier 16.

The comparator 1C compares the internal analog dimming signal VDCD2 inputted to a non-inverted input terminal (+) thereof with a threshold voltage VL (having a hysteresis of, for example, 0.13 V/0.17 V) inputted to an inverted input terminal (−) thereof so as to generate an internal enable signal EN. The internal enable signal EN turns to a low level (=a logic level at a time of performing forcible resetting) when VDCD2<VL and to a high level (=a logic level at a time of releasing the forcible resetting) when VDCD2>VL. When the switching power supply X is forcibly reset, the output current Io is turned off to reset all states (an abnormality flag).

The internal analog dimming signal VDCD2 may be a voltage signal proportional to the external analog dimming signal VDCD1. Particularly, the external analog dimming signal VDCD1 and the internal analog dimming signal VDCD2 may be equal in value. Thus, in the following description, the external analog dimming signal VDCD1 and the internal analog dimming signal VDCD2 may be collectively referred to simply as an analog dimming signal VDCD without being distinguished from each other.

Figure 5:
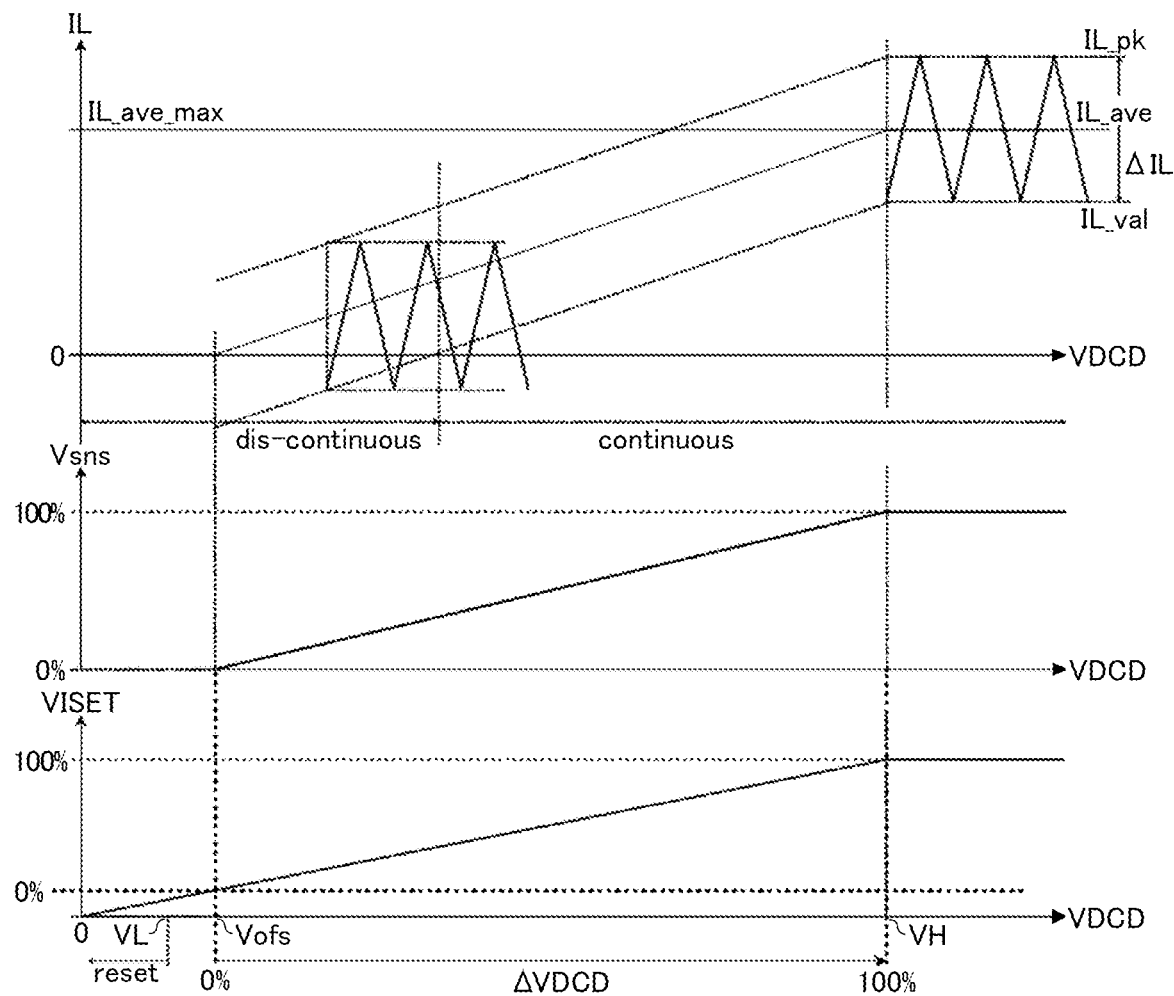
FIG. 5 is a view showing analog dimming control.

FIG. 5 is a view showing analog dimming control performed by the LED driver IC 10, in which the inductor current IL, the sense voltage Vsns, and the current setting signal VISET are depicted in order from top to bottom. Furthermore, a horizontal axis in this figure indicates the analog dimming signal VDCD.

In the LED driver IC 10, the current setting signal VISET (and hence the sense voltage Vsns) is caused to vary linearly in accordance with the analog dimming signal VDCD, and thus the average value IL_ave of the inductor current IL (and hence the output current Io) can be adjusted.

With reference to this figure, when a voltage equal to or higher than a voltage of the offset signal Vofs is inputted as the analog dimming signal VDCD, the sense voltage Vsns keeps increasing linearly. When VDCD≤Vofs, Vsns=0 V, and thus a dimming degree of the LED load Z is 0% (an extinguished state). On the other hand, when VDCD≥VH, Vsns=(VH−Vofs)/A, and thus the dimming degree of the LED load Z is 100% (a fully lit state).

When the sense voltage Vsns is decreased continuously by analog light reduction, the average value IL_ave of the inductor current IL decreases, and thus the bottom value IL_val of the inductor current IL also decreases. Herein, when IL_val<0, the switching power supply X undergoes a transition from a continuous current mode to a discontinuous current mode. Even in such a case, driving the output stage of the switching power supply based on the synchronous rectification scheme enables stable implementation of the inductor average current control described earlier.

As described above, the current setting signal VISET to be used as a reference for the error amplifier 16 is linearly controlled in accordance with the analog dimming signal VDCD, and thus analog dimming of the LED load Z can be achieved.

It is to be noted, however, that the level shifter 1A described earlier is required for the external analog dimming signal VDCD1 referenced to the ground potential GND to be inputted to a small-signal circuit system (including the error amplifier 16) referenced to a negative potential (=the output voltage Vout) applied to the SINN pin.

<Level Shifter>

Figure 6:
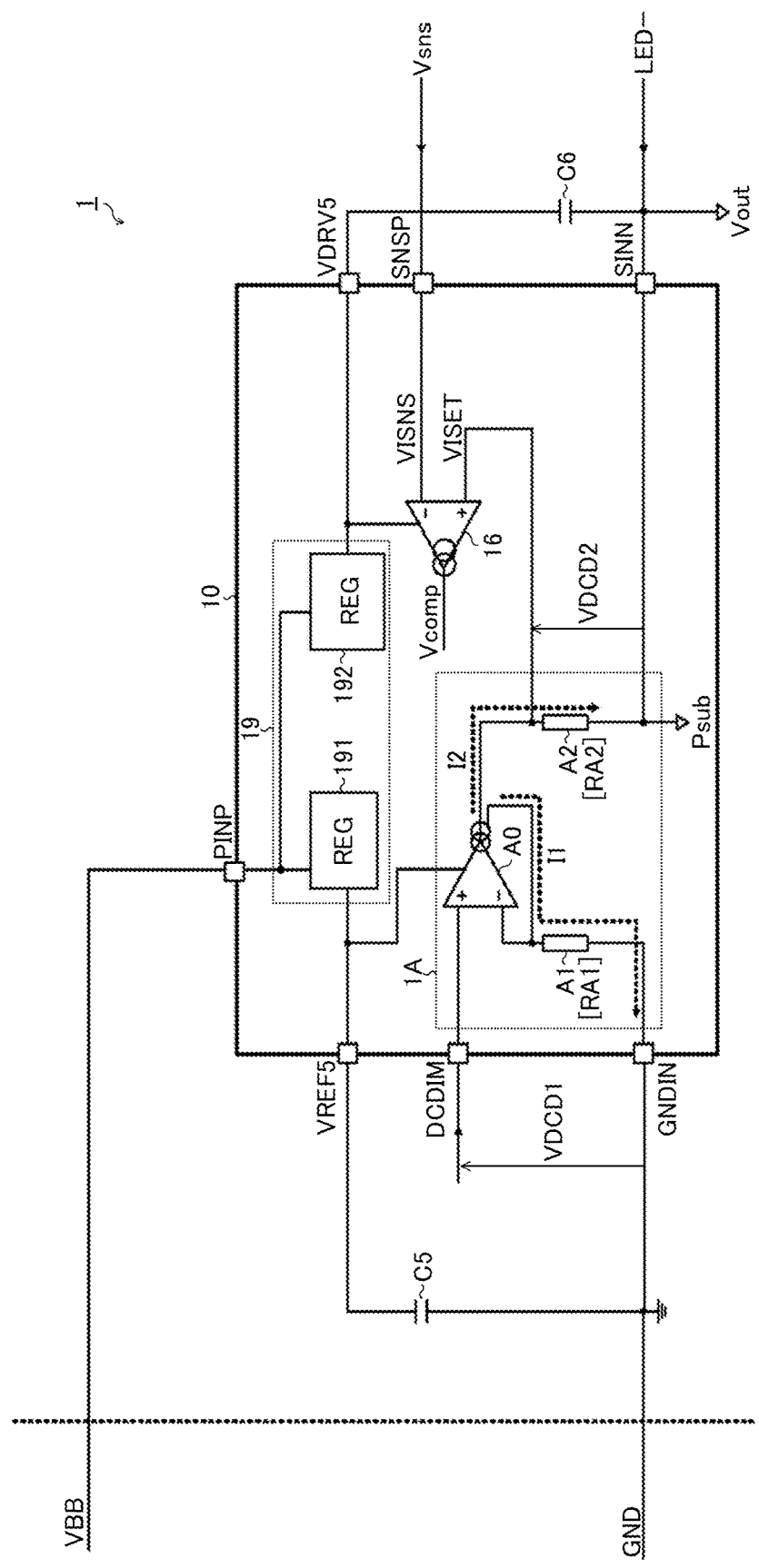
FIG. 6 is a view showing a configuration example of a level shifter.

FIG. 6 is a view showing a configuration example of the level shifter 1A. The level shifter 1A of this configuration example includes a current output amplifier A0 and resistors A1 and A2 (resistance values: RA1 and RA2). Furthermore, this figure shows a first internal power supply 191 and a second internal power supply 192 as constituent elements of the regulator 19 described earlier.

The first internal power supply 191 generates, from the power supply voltage VBB inputted to the PINP pin, the reference voltage VREF5 (for example, 5 V) referenced to the ground potential GND applied to the GNDIN pin as the internal circuitry power supply and the analog dimming/PWM dimming setting power supply. The reference voltage VREF5 is supplied to, for example, the current output amplifier A0.

The second internal power supply 192 generates, from the power supply voltage VBB inputted to the PINP pin, the reference voltage VDRV5 (for example, 5 V) referenced to a negative potential (=the output voltage Vout) applied to the SINN pin as the internal circuitry power supply and a built-in MOSFET driving power supply. The reference voltage VDRV5 is supplied to, for example, the error amplifier 16.

A non-inverted input terminal (+) of the current output amplifier A0 is connected to the DCDIM pin (=an application terminal of the external analog dimming signal VDCD1). An inverted input terminal (−) and a first output terminal of the current output amplifier A0 are both connected to a first terminal of the resistor A1. A second output terminal of the current output amplifier A0 is connected to a first terminal of the resistor A2 (=an application terminal of the internal analog dimming signal VDCD2). A second terminal of the resistor A1 is connected to the GNDIN pin (=the application terminal of the ground potential GND). A second terminal of the resistor A2 is connected to the SINN pin (=an application terminal of a negative potential lower than the ground potential GND). The SINN pin is electrically connected to a p-type semiconductor substrate as a component for forming the LED driver IC 10.

While this figure shows, for the sake of convenience of explanation, an example in which the first terminal of the resistor A2 is directly connected to a non-inverted input terminal (+) of the error amplifier 16, the buffer 1B may be interposed therebetween as shown in FIG. 4 referred to earlier.

The current output amplifier A0 connected in this manner outputs a first output current I1 and a second output current I2 through the first output terminal and the second output terminal thereof, respectively. The current output amplifier A0 operates so that the non-inverted input terminal (+) and the inverted input terminal (−) thereof imaginarily short out, and thus I1=VDCD1/RA1 is established.

Furthermore, the current output amplifier A0 duplicates the first output current I1 by use of a current mirror so as to generate the second output current I2. That is, the second output current I2 is proportional to the first output current I1. Particularly, the second output current I2 may be equal in value to the first output current I1.

The second output current I2 is flown into the SINN pin via the resistor A2. The internal analog dimming signal VDCD2 derived through the first terminal of the resistor A2, therefore, is a voltage signal (=I2×RA2) corresponding to the second output current I2. Accordingly, when I1=I2 and RA1=RA2, VDCD1=VDCD2.

It is, however, sufficient that the internal analog dimming signal VDCD2 is proportional to the external analog dimming signal VDCD1. That is, there may be a case where I1≠I2 or RA1≠RA2.

As described above, in the level shifter 1A of this configuration example, the external analog dimming signal VDCD1 referenced to GNDIN is accepted at the non-inverted input terminal (+) of the current output amplifier A0, and the first output current I1 and the second output current I2 are generated so that a voltage across the resistor A2 agrees with a voltage of the external analog dimming signal VDCD1, as a result of which the internal analog dimming signal VDCD2 referenced to SINN is outputted through the first terminal of the resistor A2.

According to such a configuration, level shifting from the external analog dimming signal VDCD1 referenced to GNDIN to the internal analog dimming signal VDCD2 referenced to SINN can be performed with high accuracy. Accordingly, the current setting signal VISET to be used as a reference for the error amplifier 16 is linearly controlled in accordance with the external analog dimming signal VDCD1, and thus analog dimming of the LED load Z can be performed with accuracy.

<Overview>

To follow is an overview of the various embodiments described thus far.

For example, a level shifter disclosed in the present description has a configuration (a first configuration) including a current output amplifier configured to output a first output current and a second output current through a first output terminal and a second output terminal thereof, respectively, a first resistor configured to be connected between each of an inverted input terminal and the first output terminal of the current output amplifier and an application terminal of a ground potential, and a second resistor configured to be connected between the second output terminal of the current output amplifier and an application terminal of a negative potential lower than the ground potential. In the level shifter, a first analog signal referenced to the ground potential is accepted at a non-inverted input terminal of the current output amplifier, and a second analog signal referenced to the negative potential is outputted through one terminal of the second resistor.

The level shifter according to the above-described first configuration may have a configuration (a second configuration) in which the second output current is proportional to the first output current.

Furthermore, the level shifter according to the above-described first or second configuration may have a configuration (a third configuration) in which the first resistor and the second resistor both have an equal resistance value.

Furthermore, a semiconductor device disclosed in the present description has a configuration (a fourth configuration) including a ground potential terminal configured to receive the ground potential applied thereto, a negative potential terminal configured to receive the negative potential applied thereto, and the level shifter according to any of the above-described first to third configurations, in which the semiconductor device functions as a component of a switching power supply.

The semiconductor device according to the above-described fourth configuration may have a configuration (a fifth configuration) further including an output feedback control unit configured to, upon accepting inputs of a sense voltage corresponding to an output current of the switching power supply and a current setting signal corresponding to the second analog signal, perform driving control of the switching power supply.

Furthermore, the semiconductor device according to the above-described fifth configuration may have a configuration (a sixth configuration) in which the output feedback control unit includes a current sense amplifier configured to amplify the sense voltage referenced to the negative potential so as to generate a current detection signal, an error amplifier configured to generate an error signal corresponding to a difference between the current detection signal and the current setting signal, an oscillator configured to generate a set signal at a predetermined switching frequency, a slope signal generation portion configured to generate, in synchronism with the set signal, a slope signal including an alternating-current component of the output current, a comparator configured to compare the error signal with the slope signal so as to generate a reset signal, a controller configured to generate a control signal in accordance with the set signal and the reset signal, and a driver configured to drive an output stage of the switching power supply in accordance with the control signal.

Furthermore, a switching power supply disclosed in the present description has a configuration (a seventh configuration) including an output stage configured to generate an output voltage having a negative polarity from an input voltage having a positive polarity, a sense resistor configured to convert the output current into the sense voltage, and the semiconductor device according to any of the above-described fourth to sixth configurations.

The switching power supply according to the above-described seventh configuration may have a configuration (an eighth configuration) in which the output stage includes a high-side switch and a low-side switch configured to be connected in series between an application terminal of the input voltage and an application terminal of the output voltage and to generate a rectangular wave-shaped switch voltage, an inductor configured to be connected between an application terminal of the switch voltage and the application terminal of the ground potential, and a capacitor configured to be connected between the application terminal of the output voltage and the application terminal of the ground potential.

Furthermore, a light emitting device disclosed in the present description has a configuration (a ninth configuration) including the switching power supply according to the above-described seventh or eighth configuration and a light emitting element configured to emit light upon receiving supply of the output current.

The light emitting device according to the above-described ninth configuration may have a configuration (a tenth configuration) in which the light emitting element includes a light emitting diode configured to have an anode connected to the application terminal of the ground potential and a cathode connected to the application terminal of the output voltage.

OTHER MODIFICATION EXAMPLES

Besides the foregoing embodiments, the various technical features disclosed in the present description may be modified in various ways without departing from the gist of technical creation thereof. That is, the foregoing embodiments are to be construed in all respects as illustrative and not limiting. It should be understood that the technical scope of the present invention is not limited to the foregoing embodiments and encompasses all modifications in the sense and scope equivalent to those of the claims.

The invention claimed is:

1. A level shifter, comprising:
   a current output amplifier configured to output a first output current and a second output current through a first output terminal and a second output terminal thereof, respectively;
   a first resistor configured to be connected between each of an inverted input terminal and the first output terminal of the current output amplifier and an application terminal of a ground potential; and
   a second resistor configured to be connected between the second output terminal of the current output amplifier and an application terminal of a negative potential lower than the ground potential,
   wherein a first analog signal referenced to the ground potential is accepted at a non-inverted input terminal of the current output amplifier, and a second analog signal referenced to the negative potential is outputted through one terminal of the second resistor.

2. The level shifter according to claim 1, wherein the second output current is proportional to the first output current.

3. The level shifter according to claim 1, wherein the first resistor and the second resistor both have an equal resistance value.

4. A semiconductor device, comprising:
a ground potential terminal configured to receive the ground potential applied thereto;
a negative potential terminal configured to receive the negative potential applied thereto; and
the level shifter according to claim 1,
wherein
the semiconductor device is configured to function as a component of a switching power supply.

5. The semiconductor device according to claim 4, further comprising:
an output feedback control unit configured to, upon accepting inputs of a sense voltage corresponding to an output current of the switching power supply and a current setting signal corresponding to the second analog signal, perform driving control of the switching power supply.

6. The semiconductor device according to claim 5, wherein
the output feedback control unit includes:
a current sense amplifier configured to amplify the sense voltage referenced to the negative potential so as to generate a current detection signal;
an error amplifier configured to generate an error signal corresponding to a difference between the current detection signal and the current setting signal;
an oscillator configured to generate a set signal at a predetermined switching frequency;
a slope signal generation portion configured to generate, in synchronism with the set signal, a slope signal including an alternating-current component of the output current;
a comparator configured to compare the error signal with the slope signal so as to generate a reset signal;
a controller configured to generate a control signal in accordance with the set signal and the reset signal; and
a driver configured to drive an output stage of the switching power supply in accordance with the control signal.

7. A switching power supply, comprising:
an output stage configured to generate an output voltage having a negative polarity from an input voltage having a positive polarity;
a sense resistor configured to convert the output current into the sense voltage; and
the semiconductor device according to claim 4.

8. The switching power supply according to claim 7, wherein
the output stage includes:
a high-side switch and a low-side switch configured to be connected in series between an application terminal of the input voltage and an application terminal of the output voltage and to generate a rectangular wave-shaped switch voltage;
an inductor configured to be connected between an application terminal of the switch voltage and the application terminal of the ground potential; and
a capacitor configured to be connected between the application terminal of the output voltage and the application terminal of the ground potential.

9. A light emitting device, comprising:
the switching power supply according to claim 7; and
a light emitting element configured to emit light upon receiving supply of the output current.

10. The light emitting device according to claim 9, wherein
the light emitting element includes a light emitting diode configured to have an anode connected to the application terminal of the ground potential and a cathode connected to the application terminal of the output voltage.

* * * * *